US010901216B2

(12) United States Patent
Pierer et al.

(10) Patent No.: US 10,901,216 B2
(45) Date of Patent: Jan. 26, 2021

(54) FREE SPACE MULTIPLE LASER DIODE MODULES

(71) Applicant: GOOGLE LLC, Mountain View, CA (US)

(72) Inventors: Jörg Pierer, Alpnach (CH); Rony Jose James, Alpnach (CH); Stefan Mohrdiek, Affoltern am Albis (CH); Douglas Raymond Dykaar, Waterloo (CA)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/168,699

(22) Filed: Oct. 23, 2018

(65) Prior Publication Data

US 2019/0121136 A1    Apr. 25, 2019

Related U.S. Application Data

(60) Provisional application No. 62/575,677, filed on Oct. 23, 2017, provisional application No. 62/576,962, (Continued)

(51) Int. Cl.
*G02B 27/01* (2006.01)
*H04N 9/31* (2006.01)
(Continued)

(52) U.S. Cl.
CPC .......... *G02B 27/0172* (2013.01); *G02B 5/32* (2013.01); *G02B 26/10* (2013.01); *G02B 26/101* (2013.01);
(Continued)

(58) Field of Classification Search
None
See application file for complete search history.

(56) References Cited

U.S. PATENT DOCUMENTS 3,408,133 A    10/1968 Lee
3,712,716 A    1/1973 Cornsweet et al.
(Continued)

FOREIGN PATENT DOCUMENTS

CN    204496106 U    7/2015
JP    61198892 A    9/1986
(Continued)

OTHER PUBLICATIONS

International Search Report and Written Opinion of the International Searching Authority, PCT/CA2018/051344, dated Feb. 19, 2019.
(Continued)

*Primary Examiner* — Kenneth B Lee, Jr.

(57) ABSTRACT

Systems, devices, and methods for optical engines and laser projectors that are well-suited for use in wearable heads-up displays (WHUDs) are described. Generally, the optical engines of the present disclosure integrate a plurality of laser diodes (e.g., 3 laser diodes, 4 laser diodes) within a single, hermetically sealed, encapsulated package. Such optical engines may have various advantages over existing designs including, for example, smaller volumes, better manufacturability, faster modulation speed, etc. WHUDs that employ such optical engines and laser projectors are also described.

3 Claims, 6 Drawing Sheets

Related U.S. Application Data filed on Oct. 25, 2017, provisional application No. 62/591,030, filed on Nov. 27, 2017, provisional application No. 62/591,550, filed on Nov. 28, 2017, provisional application No. 62/597,294, filed on Dec. 11, 2017, provisional application No. 62/608,749, filed on Dec. 21, 2017, provisional application No. 62/609,870, filed on Dec. 22, 2017, provisional application No. 62/620,600, filed on Jan. 23, 2018.

(51) Int. Cl.
*H01S 5/022* (2006.01)
*G02B 26/10* (2006.01)
*G02B 27/12* (2006.01)
*G02B 27/14* (2006.01)
*G02B 27/10* (2006.01)
*G02B 5/32* (2006.01)
*G06F 3/01* (2006.01)
*H01S 5/40* (2006.01)

(52) U.S. Cl.
CPC ....... *G02B 27/104* (2013.01); *G02B 27/1086* (2013.01); *G02B 27/123* (2013.01); *G02B 27/141* (2013.01); *G06F 3/013* (2013.01); *H01S 5/02248* (2013.01); *H01S 5/4093* (2013.01); *H04N 9/3129* (2013.01); *H04N 9/3161* (2013.01); *G02B 2027/0174* (2013.01); *G02B 2027/0178* (2013.01); *H01S 5/02288* (2013.01); *H01S 5/4012* (2013.01)

(56) References Cited

U.S. PATENT DOCUMENTS

| | | |
|---|---|---|
| 4,978,213 A | 12/1990 | El Hage |
| 5,103,323 A | 4/1992 | Magarinos et al. |
| 5,231,674 A | 7/1993 | Cleveland et al. |
| 5,467,104 A | 11/1995 | Furness, III et al. |
| 5,589,956 A | 12/1996 | Morishima et al. |
| 5,596,339 A | 1/1997 | Furness, III et al. |
| 5,742,421 A | 4/1998 | Wells et al. |
| 6,008,781 A | 12/1999 | Furness, III et al. |
| 6,027,216 A | 2/2000 | Guyton et al. |
| 6,184,847 B1 | 2/2001 | Fateh et al. |
| 6,204,829 B1 | 3/2001 | Tidwell |
| 6,236,476 B1 | 5/2001 | Son et al. |
| 6,317,103 B1 | 11/2001 | Furness, III et al. |
| 6,353,503 B1 | 3/2002 | Spitzer et al. |
| 6,377,277 B1 | 4/2002 | Yamamoto |
| 6,639,570 B2 | 10/2003 | Furness, III et al. |
| 6,972,734 B1 | 12/2005 | Ohshima et al. |
| 6,995,917 B1 | 2/2006 | Sampsell et al. |
| 7,473,888 B2 | 1/2009 | Wine et al. |
| 7,640,007 B2 | 12/2009 | Chen et al. |
| 7,684,105 B2 | 3/2010 | Lamontagne et al. |
| 7,747,113 B2 | 6/2010 | Mukawa et al. |
| 7,773,111 B2 | 8/2010 | Cleveland et al. |
| 7,850,306 B2 | 12/2010 | Uusitalo et al. |
| 7,925,100 B2 | 4/2011 | Howell et al. |
| 7,927,522 B2 | 4/2011 | Hsu |
| 8,120,828 B2 | 2/2012 | Schwerdtner |
| 8,179,604 B1 | 5/2012 | Prada Gomez et al. |
| 8,188,937 B1 | 5/2012 | Amafuji et al. |
| 8,355,671 B2 | 1/2013 | Kramer et al. |
| 8,560,976 B1 | 10/2013 | Bablumyan et al. |
| 8,634,119 B2 | 1/2014 | Amirparviz |
| 8,704,882 B2 | 4/2014 | Turner |
| 8,922,481 B1 | 12/2014 | Kauffmann et al. |
| 8,922,898 B2 | 12/2014 | Legerton et al. |
| 8,970,571 B1 | 3/2015 | Wong et al. |
| 8,971,023 B2 | 3/2015 | Olsson et al. |
| 9,086,687 B2 | 7/2015 | Park et al. |
| 9,135,708 B2 | 9/2015 | Ebisawa |
| 9,477,079 B2 | 10/2016 | Bailey et al. |
| 9,766,449 B2 | 9/2017 | Bailey et al. |
| 10,365,492 B2 | 7/2019 | Holland et al. |
| 10,437,073 B2 | 10/2019 | Holland et al. |
| 10,437,074 B2 | 10/2019 | Holland et al. |
| 10,663,732 B2 | 5/2020 | Holland et al. |
| 10,718,951 B2 | 7/2020 | Holland et al. |
| 2001/0033402 A1 | 10/2001 | Popovich |
| 2002/0003627 A1 | 1/2002 | Rieder |
| 2002/0007118 A1 | 1/2002 | Adachi et al. |
| 2002/0030636 A1 | 3/2002 | Richards |
| 2002/0093701 A1 | 7/2002 | Zhang et al. |
| 2002/0120916 A1 | 8/2002 | Snider, Jr. |
| 2003/0048421 A1 | 3/2003 | Du |
| 2004/0174287 A1 | 9/2004 | Deak |
| 2005/0012715 A1 | 1/2005 | Ford |
| 2006/0138239 A1 | 6/2006 | Sonoda et al. |
| 2006/0238707 A1 | 10/2006 | Elvesjo et al. |
| 2007/0078308 A1 | 4/2007 | Daly |
| 2007/0132785 A1 | 6/2007 | Ebersole, Jr. et al. |
| 2007/0273798 A1 | 11/2007 | Silverstein et al. |
| 2008/0273568 A1 | 11/2008 | Schulz et al. |
| 2009/0040523 A1 | 2/2009 | Brukilacchio |
| 2009/0109241 A1 | 4/2009 | Tsujimoto |
| 2009/0179824 A1 | 7/2009 | Tsujimoto et al. |
| 2009/0207464 A1 | 8/2009 | Wiltshire et al. |
| 2009/0258669 A1 | 10/2009 | Nie et al. |
| 2009/0322653 A1 | 12/2009 | Putilin et al. |
| 2010/0053555 A1 | 3/2010 | Enriquez et al. |
| 2010/0060551 A1 | 3/2010 | Sugiyama et al. |
| 2010/0142015 A1 | 6/2010 | Kuwahara et al. |
| 2010/0149073 A1 | 6/2010 | Chaum et al. |
| 2010/0150415 A1 | 6/2010 | Atkinson et al. |
| 2010/0201894 A1 | 8/2010 | Nakayama et al. |
| 2010/0239776 A1 | 9/2010 | Yajima et al. |
| 2011/0063871 A1* | 3/2011 | Tanaka ............... G02B 6/4204 362/553 |
| 2011/0134949 A1 | 6/2011 | O'Schaughnessy et al. |
| 2012/0002256 A1 | 1/2012 | Lacoste et al. |
| 2012/0139817 A1 | 6/2012 | Freeman |
| 2012/0169752 A1 | 7/2012 | Kurozuka |
| 2012/0182309 A1 | 7/2012 | Griffin et al. |
| 2012/0188158 A1 | 7/2012 | Tan et al. |
| 2012/0249797 A1 | 10/2012 | Haddick et al. |
| 2012/0290401 A1 | 11/2012 | Neven |
| 2012/0302289 A1 | 11/2012 | Kang |
| 2013/0009853 A1 | 1/2013 | Hesslink et al. |
| 2013/0016292 A1 | 1/2013 | Miao et al. |
| 2013/0016413 A1 | 1/2013 | Saeedi et al. |
| 2013/0088413 A1 | 4/2013 | Raffle et al. |
| 2013/0114629 A1 | 5/2013 | Firth et al. |
| 2013/0135722 A1 | 5/2013 | Yokoyama |
| 2013/0165813 A1 | 6/2013 | Chang et al. |
| 2013/0169560 A1 | 7/2013 | Cederlund et al. |
| 2013/0198694 A1 | 8/2013 | Rahman et al. |
| 2013/0215235 A1 | 8/2013 | Russell |
| 2013/0222384 A1 | 8/2013 | Futterer |
| 2013/0265437 A1 | 10/2013 | Thorn et al. |
| 2013/0265770 A1 | 10/2013 | Breidenassel et al. |
| 2013/0285901 A1 | 10/2013 | Lee et al. |
| 2013/0300652 A1 | 11/2013 | Raffle et al. |
| 2013/0332196 A1 | 12/2013 | Pinsker |
| 2013/0335302 A1 | 12/2013 | Crane et al. |
| 2014/0045547 A1 | 2/2014 | Singamsetty et al. |
| 2014/0125715 A1 | 5/2014 | Nishino et al. |
| 2014/0125760 A1 | 5/2014 | Au et al. |
| 2014/0126918 A1 | 5/2014 | Sato |
| 2014/0198034 A1 | 7/2014 | Bailey et al. |
| 2014/0198035 A1 | 7/2014 | Bailey et al. |
| 2014/0202643 A1 | 7/2014 | Hikmet et al. |
| 2014/0204455 A1 | 7/2014 | Popovich et al. |
| 2014/0204465 A1 | 7/2014 | Yamaguchi |
| 2014/0226193 A1 | 8/2014 | Sun |
| 2014/0232651 A1 | 8/2014 | Kress et al. |
| 2014/0240952 A1 | 8/2014 | Nakanishi et al. |
| 2014/0285429 A1 | 9/2014 | Simmons |
| 2014/0368896 A1 | 12/2014 | Nakazono et al. |
| 2015/0036221 A1 | 2/2015 | Stephenson |
| 2015/0103404 A1 | 4/2015 | Rudy et al. |

(56) References Cited

U.S. PATENT DOCUMENTS

| | | |
|---|---|---|
| 2015/0156716 A1 | 6/2015 | Raffle et al. |
| 2015/0205126 A1 | 7/2015 | Schowengerdt |
| 2015/0205134 A1 | 7/2015 | Bailey et al. |
| 2015/0268821 A1 | 9/2015 | Ramsby et al. |
| 2015/0325202 A1 | 11/2015 | Lake et al. |
| 2015/0362734 A1 | 12/2015 | Moser et al. |
| 2015/0378162 A1 | 12/2015 | Bailey et al. |
| 2016/0033771 A1 | 2/2016 | Tremblay et al. |
| 2016/0202081 A1 | 7/2016 | Debieuvre et al. |
| 2016/0238845 A1 | 8/2016 | Alexander et al. |
| 2016/0274362 A1 | 9/2016 | Tinch |
| 2016/0274365 A1 | 9/2016 | Bailey et al. |
| 2016/0274758 A1 | 9/2016 | Bailey |
| 2016/0327796 A1 | 11/2016 | Bailey et al. |
| 2016/0327797 A1 | 11/2016 | Bailey et al. |
| 2016/0334618 A1 | 11/2016 | Hargis et al. |
| 2016/0349514 A1 | 12/2016 | Alexander et al. |
| 2016/0349515 A1 | 12/2016 | Alexander et al. |
| 2016/0349516 A1 | 12/2016 | Alexander et al. |
| 2016/0377865 A1 | 12/2016 | Alexander et al. |
| 2016/0377866 A1 | 12/2016 | Alexander et al. |
| 2017/0068095 A1 | 3/2017 | Holland et al. |
| 2017/0097753 A1 | 4/2017 | Bailey et al. |
| 2017/0115483 A1 | 4/2017 | Aleem et al. |
| 2017/0153701 A1 | 6/2017 | Mahon et al. |
| 2017/0205876 A1 | 7/2017 | Vidal et al. |
| 2017/0212290 A1 | 7/2017 | Alexander et al. |
| 2017/0212349 A1 | 7/2017 | Bailey et al. |
| 2017/0219829 A1 | 8/2017 | Bailey |
| 2017/0299956 A1 | 10/2017 | Holland et al. |
| 2017/0343796 A1 | 11/2017 | Bailey et al. |
| 2017/0343797 A1 | 11/2017 | Bailey et al. |
| 2018/0007255 A1 | 1/2018 | Tang |

FOREIGN PATENT DOCUMENTS

| | | |
|---|---|---|
| JP | 10319240 A | 12/1998 |
| JP | 20130137489 A | 6/2013 |
| JP | 2013160905 A | 8/2013 |
| KR | 10-2004-006609 A | 1/2004 |
| WO | 2014155288 A2 | 10/2014 |
| WO | 2015123775 A1 | 8/2015 |

OTHER PUBLICATIONS

Non-Final Office Action dated Oct. 8, 2019 for U.S. Appl. No. 15/848,265, 20 pages.
Notice of Allowance dated Jan. 17, 2020 for U.S. Appl. No. 15/848,265, 5 pages.
Notice of Allowance dated Mar. 20, 2019 for U.S. Appl. No. 15/848,388, 17 pages.
Non-Final Office Action dated Oct. 4, 2019 for U.S. Appl. No. 15/582,188, 16 pages.
Notice of Allowance dated Mar. 16, 2020 for U.S. Appl. No. 15/582,188, 6 pages.
Non-Final Office Action dated Oct. 30, 2018 for U.S. Appl. No. 15/852,282, 20 pages.
Notice of Allowance dated May 31, 2019 for U.S. Appl. No. 15/852,282, 9 pages.
Non-Final Office Action dated Oct. 30, 2018 for U.S. Appl. No. 15/852,205, 21 pages.
Notice of Allowance dated May 31, 2019 for U.S. Appl. No. 15/852,205, 9 pages.
Non-Final Office Action dated Apr. 6, 2020 for U.S. Appl. No. 16/168,690, 9 pages.
Non-Final Office Action dated Jun. 9, 2020 for U.S. Appl. No. 16/168,694, 12 pages.
Non-Final Office Action dated Apr. 3, 2020 for U.S. Appl. No. 16/168,695, 6 pages.
Amitai, "P-27 A Two-dimensional Aperture Expander for Ultra-Compact, High-Performance Head-Worn Displays," SID Symposium Digest of Technical Papers, vol. 36, No. I (2005), pp. 360-363.
Ayras et al., "Exit pupil expander with a large field of view based on diffractive optics," Journal of the SID, vol. 17, No. 8 (2009), pp. 659-664.
Chellappan et al., "Laser-based display: a review," Applied Optics, vol. 49, No. 25 (2010), pp. 79-98.
Cui et al., "Diffraction from angular multiplexing slanted volume hologram gratings," Optik, vol. 116 (2005), pp. 118-122.
Curatu et al., "Dual Purpose Lens for an Eye-tracked Projection Head-Mounted Display," International Optical Design Conference 2006, SPIE-OSA, vol. 6342 (2007), pp. 63420X-I-63420X-7.
Curatu et al., "Projection-based head-mounted display with eye-tracking capabilities," Proc. Of SPIE, vol. 5875 (2005), pp. 58750J-I-58750J-9.
Essex, "Tutorial on Optomechanical Beam Steering Mechanisms," College of Optical Sciences, University of Arizona, 2006, 8 pages.
Fernandez et al., "Optimization of a thick polyvinyl alcohol-acrylamide photopolymer for data storage using a combination of angular and peristrophic holographic multiplexing," Applied Optics, vol. 45, No. 29 (2006), pp. 7661-7666.
Hainich et al., "Chapter 10 Near-Eye Displays," in Displays—Fundamentals and Applications, 2011, DD. 439-503.
Hornstein et al., "Maradin's Micro-Mirror—System Level Synchronization Notes," SID 2012 Digest (2012), pp. 981-984.
Itoh et al., "Interaction-free calibration for optical see-through head-mounted displays based on 3D eye localization," 2014 IEEE Symposium on 3D User Interfaces (3DUI), (2014), pp. 75-82.
Janssen, "Radio Frequency (RF)" 2013, retrieved from https://web.archive.org/web/20130726153946/https://www.techopedia.com/definition/5083/radiofrequency-rf, retrieved on Jul. 12, 2017, 2 pages.
Kessler, "Optics of Near to Eye Displays (NEDs)," Oasis 2013, Tel Aviv, Israel, Feb. 19, 2013, 37 pages.
Kress et al., "A review of head-mounted displays (HMD) technologies and applications for consumer electronics," Proc. Of SPIE, vol. 8720 (2013), DD. 87200A-I-87200A-13.
Kress et al., "Diffractive and Holographic Optics as Optical Combiners in Head Mounted Displays," Proceedings of the 2013 ACM Conference on Pervasive and Ubiquitous Computing Adjunct Publication, Zurich, Switzerland, Sep. 8-12, 2013, pp. 1479-1482.
Kress, "Optical architectures for see-through wearable displays," Bay Area—SID Seminar, Bay Area, Apr. 30, 2014, 156 pages.
Levola, "7.1 Invited Paper: Novel Diffractive Optical Components for Near to Eye Displays," SID Symposium Digest of Technical Papers, vol. 37, No. 1 (2006), pp. 64-67.
Liao et al., "The Evolution of MEMS Displays," IEEE Transcations on Industrial Electronics, vol. 56, No. 4 (2009), pp. 1057-1065.
Lippert, "Chapter 6 Display Devices: RSD (Retinal Scanning Display)," in The Avionics Handbook, 2001, 8 pages.
Majaranta et al., "Chapter 3: Eye-Tracking and Eye-Based Human-Computer Interaction," in Advances in Physiological Computing, 2014, pp. 39-65.
Merriam-Webster, "Radio Frequencies" retrieved from https://www.merriamwebster.com.table/collegiate/radiofre.htm, retrieved on Jul. 12, 2017, 2 pages.
Schowengerdt et al., "Stereoscopic retinal scanning laser display with integrated focus cues for ocular accommodation," Proc. Of SPIE-IS and T Electronic Imaging, vol. 5291 (2004), pp. 366-376.
Silverman et al., "58.5L Late-News Paper: Engineering a Retinal Scanning Laser Display with Integrated Accommodative Depth Cues," SID 03 Digest, (2003), pp. 1538-1541.
Takatsuka et al., "Retinal projection display using diffractive optical element," Tenth International Conference on Intelligent Information Hiding and Multimedia Signal Processing, IEEE, (2014), pp. 403-406.
Urey et al., "Optical performance requirements for MEMS-scanner based microdisplays," Conf. On MOEMS and Miniaturized Systems, SPIE, vol. 4178 (2000), pp. 176-185.
Urey, "Diffractive exit-pupil expander for display applications," Applied Optics, vol. 40, No. 32 (2001), pp. 5840-5851.
Viirre et al., "The Virtual Retina Display: A New Technology for

(56) References Cited

OTHER PUBLICATIONS

Virtual Reality and Augmented Vision in Medicine," Proc. Of Medicine Meets Virtual Reality (1998), pp. 252-257.

* cited by examiner

FREE SPACE MULTIPLE LASER DIODE MODULES

BACKGROUND

Technical Field

The present disclosure is generally directed to systems, devices, and methods relating to optical engines, for example, optical engines for laser projectors used in wearable heads-up displays or other applications.

Description of the Related Art

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, at least one controllable mirror may be used to control the spatial distribution, and may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

In a conventional laser projector comprising an RGI (red/green/blue) laser module with a red laser diode, a green laser diode, and a blue laser diode, each respective laser diode may have a corresponding respective focusing lens. Each of the laser diodes of a laser module are typically housed in a separate package (e.g., a TO-38 package or "can"). The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. A "combiner" component of a wearable heads-up display is the physical structure where display light and environmental light merge as one within the user's field of view. The combiner of a wearable heads-up display is typically transparent to environmental light but includes some optical routing mechanism to direct display light into the user's field of view.

Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, however, users also care a lot about aesthetics and comfort. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal or comfort. Most wearable heads-up displays presented to date employ relatively large components and, as a result, are considerably bulkier, less comfortable and less stylish than conventional eyeglass frames.

BRIEF SUMMARY

An optical engine may be summarized as including a base substrate; a plurality of chip submounts bonded to the base substrate; a plurality of laser diodes, each of the plurality of laser diodes bonded to a corresponding one of the plurality of chip submounts; at least one laser diode driver circuit bonded to the base substrate, the at least one laser diode driver circuit operatively coupled to the plurality of laser diodes to selectively drive current to the plurality of laser diodes; and a cap comprising at least one wall and at least one optical window that together define an interior volume sized and dimensioned to receive at least the plurality of chip submounts and the plurality of laser diodes, the cap being bonded to the base substrate to provide a hermetic seal between the interior volume of the cap and a volume exterior to the cap, and the optical window positioned and oriented to allow light emitted from the plurality of laser diodes to exit the interior volume. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC) or alumina.

The optical engine may further include an optical director element disposed within the interior volume, the optical director element bonded to the base substrate proximate the plurality of laser diodes, and positioned and oriented to reflect laser light from the plurality of laser diodes toward the optical window of the cap. The optical director element may include a mirror or a prism. The at least one laser diode driver circuit may be bonded to a first surface of the base substrate, and the plurality of chip submounts and the cap may be bonded to a second surface of the base substrate, the second surface of the base substrate opposite the first surface of the base substrate.

The optical engine may further include a plurality of collimation lenses bonded to the optical window, each of the plurality of collimation lenses positioned and oriented to receive light from a corresponding one of the plurality of laser diodes through the optical window.

The optical engine may further include a beam combiner positioned and oriented to combine light beams received from each of the collimation lenses into a single aggregate beam. Each of the laser diodes may include one of an edge emitter laser or a vertical-cavity surface-emitting laser (VCSEL). The at least one wall of the cap may include at least one continuous sidewall having a lower first end and an upper second end, the lower first end bonded to the base substrate, and the optical window may be hermetically sealed to the cap proximate the upper second end.

A wearable heads-up display (WU)) may be summarized as including a support structure that in use is worn on the head of a user; a laser projector carried by the support structure, the laser projector comprising: optical engine, including a base substrate; a plurality of chip submounts bonded to the base substrate; a plurality of laser diodes, each of the plurality of laser diodes bonded to a corresponding one of the plurality of chip submounts; at least one laser diode driver circuit bonded to the base substrate, the at least one laser diode driver circuit operatively coupled to the plurality of laser diodes to selectively drive current to the plurality of laser diodes; and a cap comprising at least one wall and at least one optical window that together define an interior volume sized and dimensioned to receive at least the plurality of chip submounts and the plurality of laser diodes, the cap being bonded to the base substrate to provide a hermetic seal between the interior volume of the cap and a volume exterior to the cap, and the optical window positioned and oriented to allow light emitted from the plurality of laser diodes to exit the interior volume; and at least one scan mirror positioned to receive laser light from the plurality of laser diodes and controllably orientable to redirect the laser light over a range of angles.

The WHUD may further include a processor communicatively coupled to the laser projector to modulate the generation of light signals. The laser projector may further include a beam combiner positioned and oriented to combine light beams emitted from the plurality of laser diodes into a single aggregate beam.

The WHUD may further include a transparent combiner carried by the support structure and positioned within a field of view of the user, in operation the transparent combiner directs laser light from an output of the laser projector into the field of view of the user.

A laser projector may be summarized as including an optical engine, including a base substrate; a plurality of chip submounts bonded to the base substrate; a plurality of laser diodes, each of the plurality of laser diodes bonded to a corresponding one of the plurality of chip submounts; at least one laser diode driver circuit bonded to the base substrate, the at least one laser diode driver circuit operatively coupled to the plurality of laser diodes to selectively drive current to the plurality of laser diodes; and a cap comprising at least one wall and at least one optical window that together define an interior volume sized and dimensioned to receive at least the plurality of chip submounts and the plurality of laser diodes, the cap being bonded to the base substrate to provide a hermetic seal between the interior volume of the cap and a volume exterior to the cap, and the optical window positioned and oriented to allow light emitted from the plurality of laser diodes to exit the interior volume; and at least one scan mirror positioned to receive laser light from the plurality of laser diodes and controllably orientable to redirect the laser light over a range of angles.

The laser projector may further include a processor communicatively coupled to optical engine to modulate the generation of light signals.

The laser projector may further include a beam combiner positioned and oriented to combine light beams emitted from the plurality of laser diodes into a single aggregate beam.

A method of operating an optical engine, the optical engine including a plurality of laser diodes hermetically sealed in an encapsulated package, may be summarized as including causing the plurality of laser diodes to generate laser light; receiving the laser light from the laser diodes by at least one optical director element; redirecting, by the at least one optical director element, the received laser light toward an optical window of the encapsulated package; and collimating, by a plurality of collimation lenses, the laser light from the laser diodes that exits the encapsulated package via the optical window to generate a plurality of laser light beams.

The method may further include combining, via a beam combiner, the plurality of laser light beams received from each of the collimation lenses into a single aggregate beam.

Causing the plurality of laser diodes to generate laser light may include causing a red laser diode to generate red laser light, causing a green laser diode to generate green laser light, causing a blue laser diode to generate blue laser light, and causing an infrared laser diode to generate infrared laser light.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure provide laser-based optical engines, for example, laser-based optical engines for laser projectors used in wearable heads-up displays or other applications. Generally, the optical engines discussed herein integrate a plurality of laser dies or diodes (e.g., 3 laser diodes, 4 laser diodes) within a single, hermetically sealed, encapsulated package. Such optical engines may have various advantages over existing designs including, for example, smaller volume, lower weight, better manufacturability, lower cost, faster modulation speed, etc. As noted above, such features are particularly advantages in various applications including WHUDs.

Figure 1A:
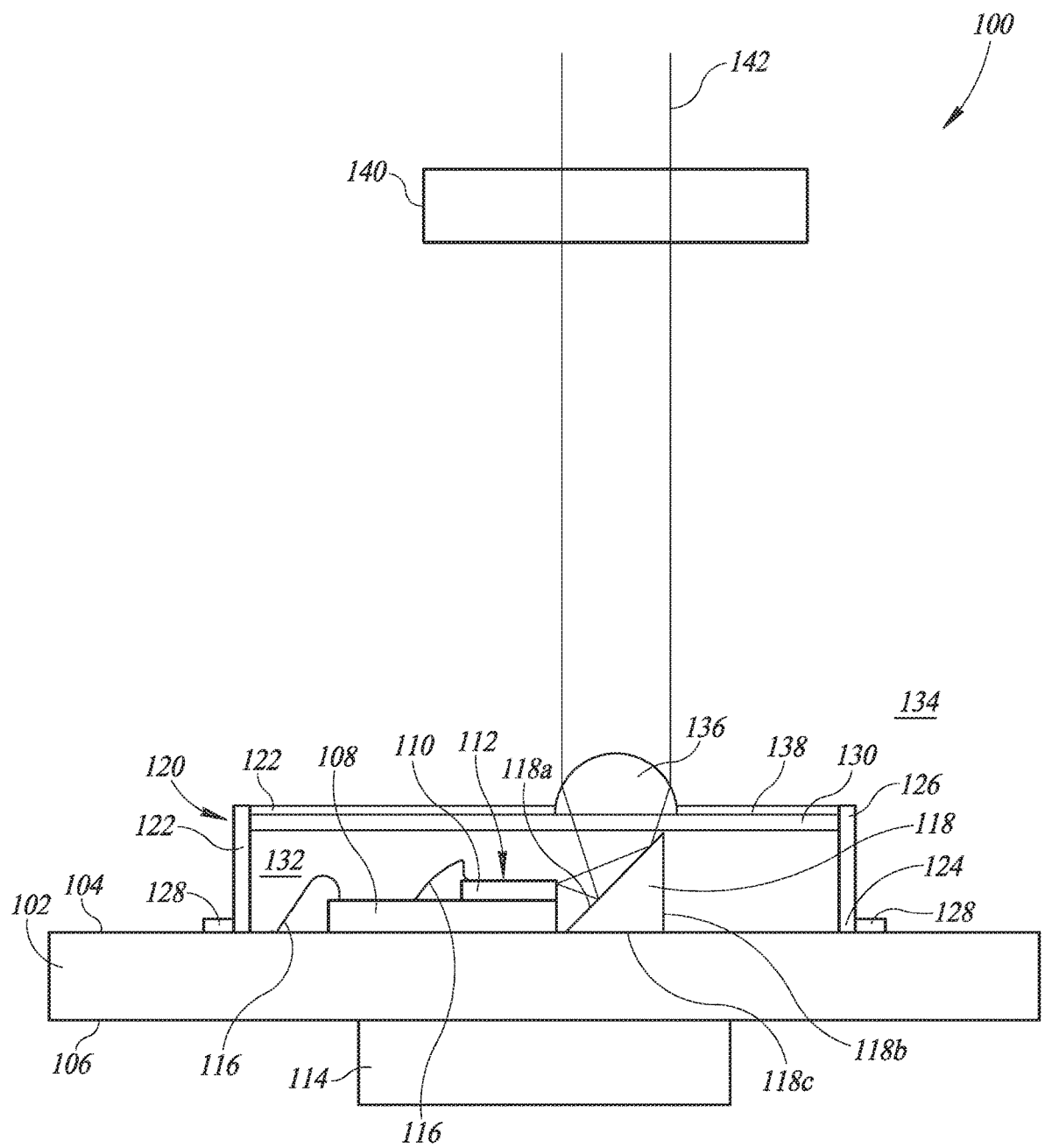
FIG. 1A is a left side, sectional elevational view of an optical engine, in accordance with the present systems, devices, and methods.
Figure 1B:
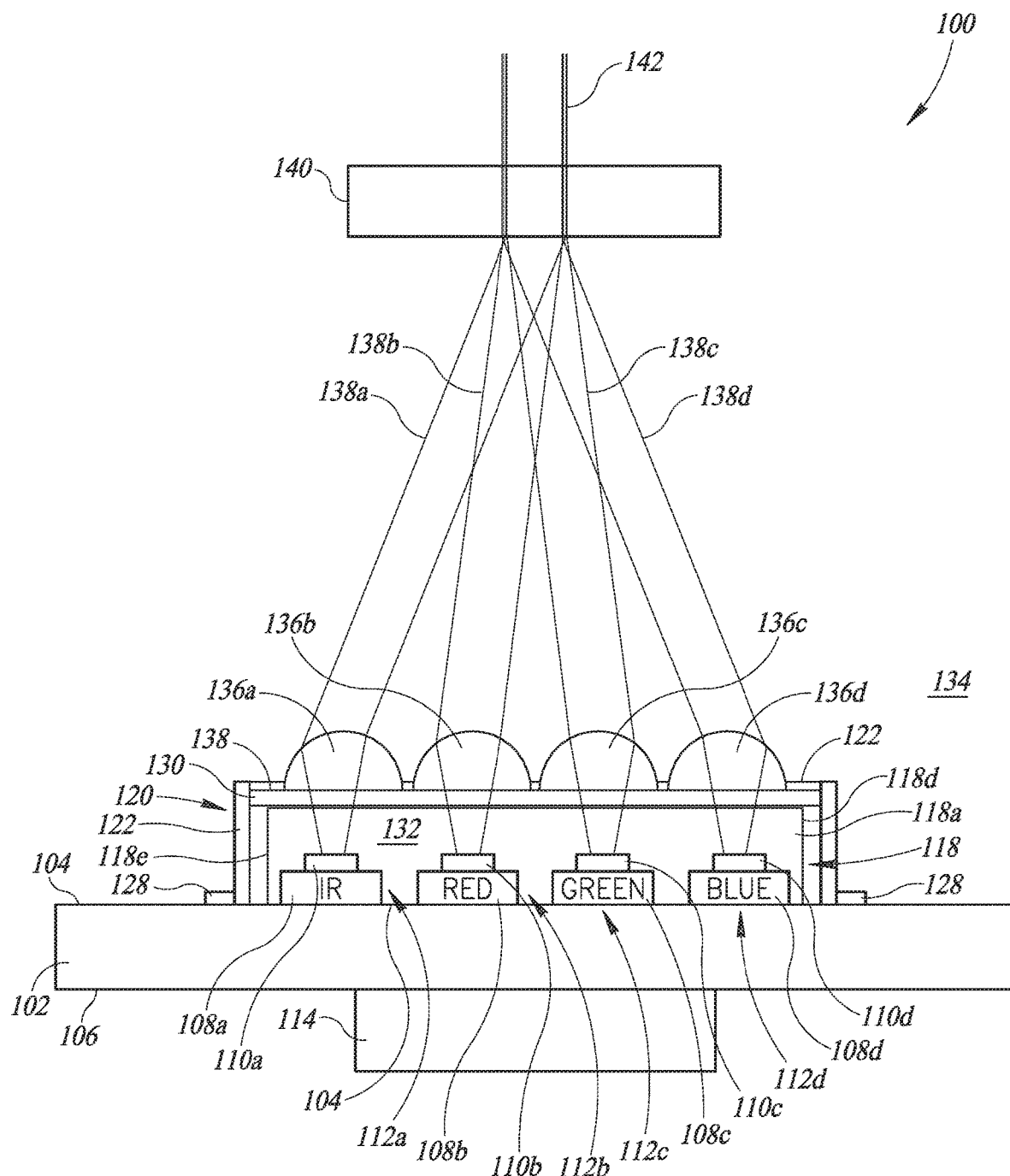
FIG. 1B is a front side, sectional elevational view of the optical engine also shown in FIG. 1A, in accordance with the present systems, devices, and methods.

FIG. 1A is a left side, elevational sectional view of an optical engine 100, which may also be referred to as a "multi-laser diode module" or an "RGB laser module," in accordance with the present systems, devices, and methods. FIG. 1B is a front side, elevational sectional view of the optical engine 100. The optical engine 100 includes a base substrate 102 having a top surface 104 and a bottom surface 106 opposite the top surface. The base substrate 102 may be formed from a material that is radio frequency (RF) compatible and is suitable for hermetic sealing. For example, the base substrate 102 may be formed from low temperature co-fired ceramic (LTCC), alumina, etc.

The optical engine 100 also includes a plurality of chip submounts 108a-108d (collectively 108) bonded to the top surface 104 of the base substrate 102. The plurality of chip submounts 108 are aligned in a row across a width of the optical engine 100 between the left and right sides thereof. Each of the plurality of chip submounts 108 includes a laser diode 110, also referred to as a laser chip or laser die, bonded thereto. In particular, an infrared chip submount 108a carries an infrared laser diode 110a, a red chip submount 108b carries a red laser diode 110b, a green chip submount 108c carries a green laser diode 110c, and a blue chip submount 108d carries a blue laser diode 110d. In operation, the infrared laser diode 110a provides infrared laser light, the red laser diode 110b provides red laser light, the green laser diode 110c provides green laser light, and the blue laser diode 110d provides blue laser light. Each of the laser diodes 110 may comprise one of an edge emitter laser or a vertical-cavity surface-emitting laser (VCSEL), for example. Each of the four laser diode/chip submount pairs may be referred to collectively as a "laser chip on submount," or a laser CoS 112. Thus, the optical engine 100 includes an infrared laser CoS 112a, a red laser CoS 112b, a green laser CoS 112c, and a blue laser CoS 112d. In at least some implementations, one or more of the laser diodes 110 may be bonded directly to the base substrate 102 without use of a submount 108.

The optical engine 100 also includes a laser diode driver circuit 114 bonded to the bottom surface 106 of the base substrate 102. The laser diode driver circuit 114 is operatively coupled to the plurality of laser diodes 110 via suitable electrical connections 116 to selectively drive current to the plurality of laser diodes. Generally, the laser diode driver circuit 114 may be positioned relative to the CoSs 112 to minimize the distance between the laser diode driver circuit 114 and the CoSs 112. Although not shown in FIGS. 1A and 1B, the laser diode driver circuit 114 may be operatively coupleable to a controller e.g., microcontroller, microprocessor, ASIC) which controls the operation of the laser diode driver circuit 114 to selectively modulate laser light emitted by the laser diodes 110, In at least some implementations, the laser diode driver circuit 114 may be bonded to another portion of the base substrate 102, such as the top surface 104 of the base substrate.

Proximate the laser diodes 110 there is positioned an optical director element 118. Like the chip submounts 108, the optical director element 118 is bonded to the top surface 104 of the base substrate 102. In the illustrated example, the optical director element 118 has a triangular prism shape that includes a plurality of planar faces. In particular the optical director element 118 includes an angled front face 118a that extends along the width of the optical engine 100, a rear face 118b, a bottom face 118c that is bonded to the top surface 104 of the base substrate 102, a left face 118d, and a right face 118e opposite the left face. The optical director element 118 may comprise a mirror or a prism, for example.

The optical engine 100 also includes a cap 120 that includes a vertical sidewall 122 having a lower first end 124 and an upper second end 126 opposite the first end. A flange 128 may be disposed around a perimeter of the sidewall 122 adjacent the lower first end 124. Proximate the upper second end 126 of the sidewall 122 there is a horizontal optical window 130 that forms the "top" of the cap 120. The sidewall 122 and the optical window 130 together define an interior volume 132 sized and dimensioned to receive the plurality of chip submounts 108, the plurality of laser diodes 110, and the optical director element 118. The lower first end 124 and the flange 128 of the cap 120 are bonded to the base substrate 102 to provide a hermetic seal between the interior volume 132 of the cap and a volume 134 exterior to the cap.

As shown best in FIG. 1A, the optical director element 118 is positioned and oriented to direct (e.g., reflect) laser light received from each of the plurality of laser diodes 108 upward (as shown) toward the optical window 130 of the cap 120, wherein the laser light exits the interior volume 132.

The cap 120 may have a round shape, rectangular shape, or other shape. Thus, the vertical sidewall 122 may comprise a continuously curved sidewall, a plurality (e.g., four) of adjacent planar portions, etc. The optical window 130 may comprise an entire top of the cap 120, or may comprise only a portion thereof. In at least some implementations, the optical window 130 may be located on the sidewall 122 rather than positioned as a top of the cap 120, and the laser diodes 110 and/or the optical director element 118 may be positioned and oriented to direct the laser light from the laser diodes toward the optical window on the sidewall 122. In at least some implementations, the cap 120 may include a plurality of optical windows instead of a single optical window.

The optical engine 100 also includes four collimation/pointing lenses 136a-136d (collectively 136), one for each of the four laser diodes 110a-110d, respectively, that are bonded to a top surface 138 of the optical window 130. Each of the plurality of collimation lenses 136 is positioned and oriented to receive light from a corresponding one of the laser diodes 110 through the optical window 130. In particular, the collimation lens 136a receives light from the infrared laser diode 110a via the optical director element 118 and the optical window 130, the collimation lens 136b receives light from the red laser diode 110b via the optical director element and the optical window, the collimation lens 136c receives light from the green laser diode 110c via the optical director element and the optical window, and the collimation lens 136d receives light from the blue laser diode 110d via the optical director element and the optical window.

Each of the collimation lenses 136 is operative to receive laser light from a respective one of the laser diodes 110, and to generate a single color beam. In particular, the collimation lens 136a receives infrared laser light from the infrared laser diode 110a and produces an infrared laser beam 138a, the collimation lens 136b receives red laser light from the red laser diode 110b and produces a red laser beam 138b, the collimation lens 136c receives green laser light from the green laser diode 110c and produces a green laser beam 138c, and the collimation lens 136d receives blue laser light from the blue laser diode 110d and produces a blue laser beam 138d.

Figure 3:
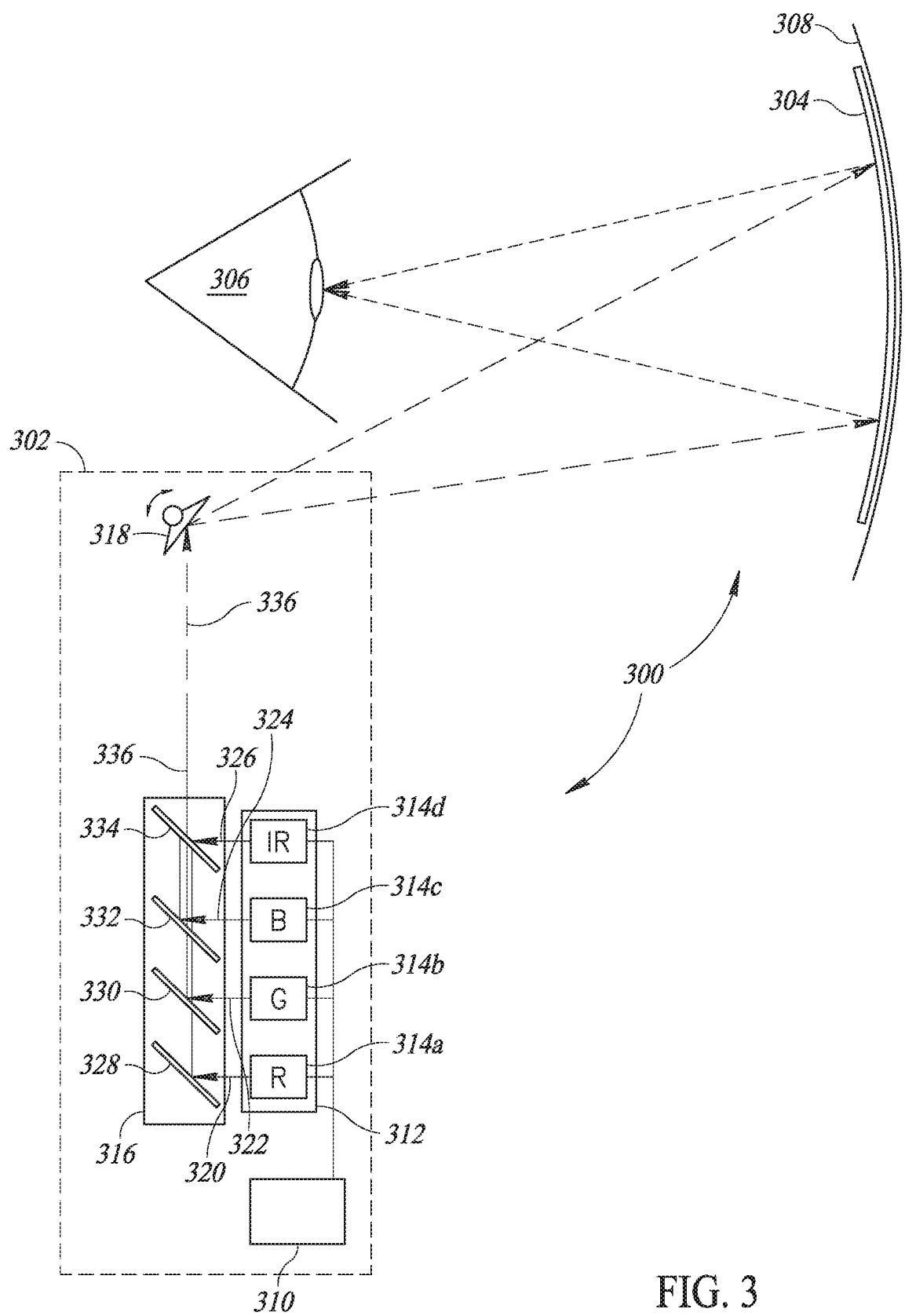
FIG. 3 is a schematic diagram of a wearable heads-up display with a laser projector that includes an optical engine, and a transparent combiner in a field of view of an eye of a user, in accordance with the present systems, devices, and methods.

The optical engine 100 may also include, or may be positioned proximate to, a beam combiner 140 that is positioned and oriented to combine the light beams 138a-138d received from each of the collimation lenses 136 into a single aggregate beam 142. As an example, the beam combiner 140 may include one or more diffractive optical elements (DOE) and/or refractive/reflective optical elements that combine the different color beams 138a-138d in order to achieve coaxial superposition. An example beam combiner is shown in FIG. 3 and discussed below.

In at least some implementations, the laser CoSs 112, the optical director element 118, and/or the collimation lenses 136 may be positioned differently. As noted above, laser diode driver circuit 114 may be mounted on the top surface 104 or the bottom surface 106 of the base substrate 102, depending on the RF design and other constraints (e.g., package size). In at least some implementations, the optical engine 100 may not include the optical director element 118, and the laser light may be directed from the laser diodes 110 toward the collimation lenses 136 without requiring an intermediate optical director element. Additionally, in at least some implementations, one or more of the laser diodes may be mounted directly on the base substrate 102 without use of a submount.

For the sake of a controlled atmosphere inside the interior volume 132, it may be desirable to have no organic compounds inside the interior volume 132. In at least some implementations, the components of the optical engine 100 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 100. Various bonding processes for the optical engine 100 are discussed below with reference to FIG. 5.

Figure 2:
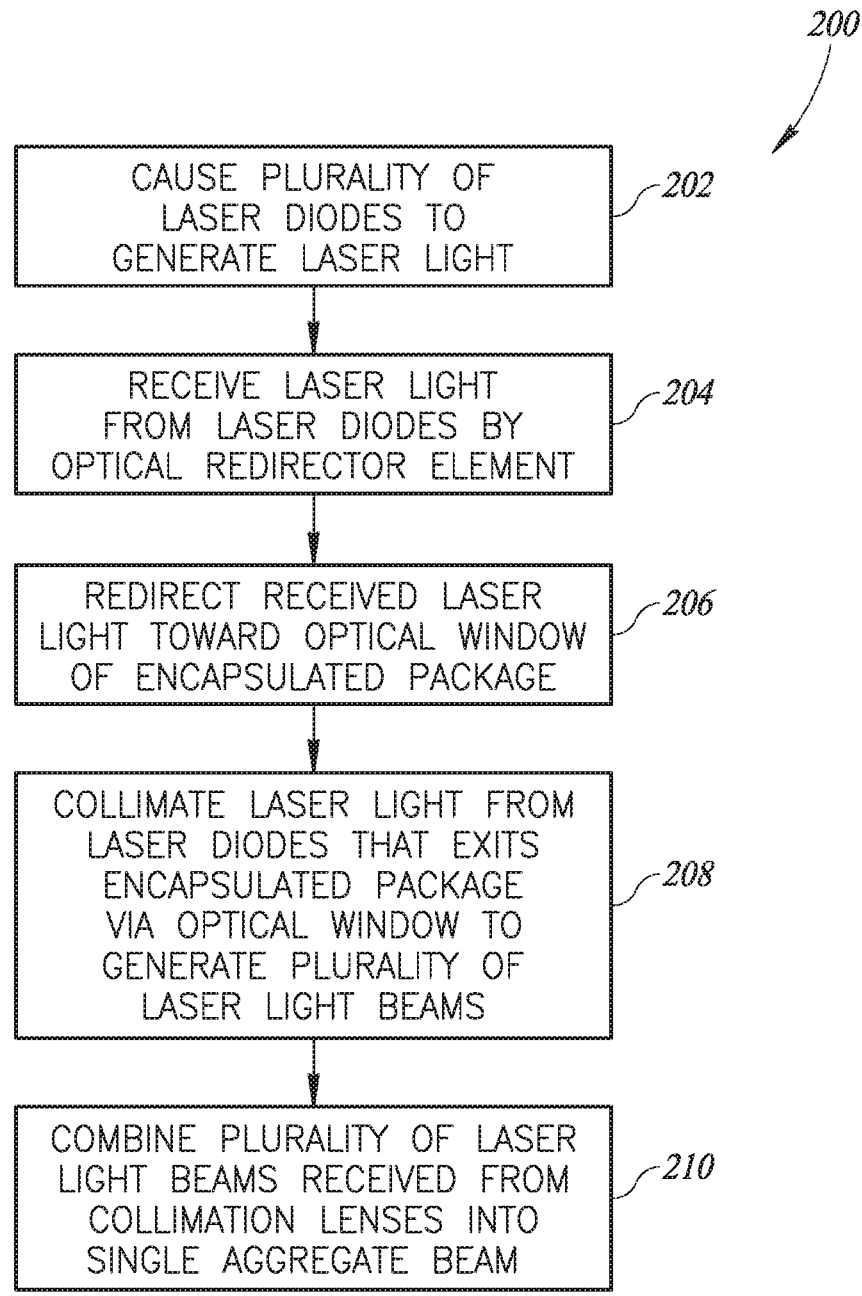
FIG. 2 is a flow diagram of a method of operating an optical engine, in accordance with the present systems, devices, and methods.

FIG. 2 is a flow diagram of a method 200 of operating an optical engine, in accordance with the present systems, devices, and methods. The method 200 may be implemented using the optical engine 100 of FIGS. 1A-1B, for example. It should be appreciated that methods of operating optical engines according to the present disclosure may include fewer or additional acts than set forth in the method 200. Further, the acts discussed below may be performed in an order different than the order presented herein.

At 202, at least one controller may cause a plurality of laser diodes of an optical engine to generate laser light. As discussed above, the plurality of laser diodes may be hermetically sealed in an encapsulated package. The laser diodes may produce light sequentially and/or simultaneously with each other. At 204, at least one optical director element may receive the laser light from the laser diodes. The optical director element may comprise a mirror or a prism, for example. As discussed above, in at least some implementations the optical engine may be designed such that laser light exits the optical engine without use of an optical director element.

At 206, the at least one optical director element may direct the received laser light toward an optical window of the encapsulated package. For example, the optical director element may reflect the received laser light toward the optical window of the encapsulated package.

At 208, a plurality of collimation lenses may collimate the laser light from the laser diodes that exits the encapsulated package via the optical window to generate a plurality of differently colored laser light beams. The collimation lenses may be positioned inside or outside of the encapsulated package. As an example, the collimation lenses may be physically coupled to the optical window of the encapsulated package.

At 210, a beam combiner may combine the plurality of laser light beams received from each of the collimation lenses into a single aggregate beam. The beam combiner may include one or more diffractive optical elements (DOE) that combine different color beams in order to achieve coaxial superposition, for example. The beam combiner may include one or more DOEs and/or one or more refractive/reflective optical elements. An example beam combiner is shown in FIG. 3 and discussed below.

FIG. 3 is a schematic diagram of a wearable heads-up display (WHUD) 300 with an exemplary laser projector 302, and a transparent combiner 304 in a field of view of an eye 306 of a user of the WHUD, in accordance with the present systems, devices, and methods. The WHUD 300 includes a support structure (not shown), with the general shape and appearance of an eyeglasses frame, carrying an eyeglass lens 308 with the transparent combiner 304, and the laser projector 302.

The laser projector 302 comprises a controller or processor 310, an optical engine 312 comprising four laser diodes 314a, 314b, 314c, 314d (collectively 314) communicatively coupled to the processor 310, a beam combiner 316, and a scan mirror 318. The optical engine 312 may be similar or identical to the optical engine 100 discussed above with reference to FIGS. 1A and 1B. Generally, the term "processor" refers to hardware circuitry, and may include any of microprocessors, microcontrollers, application specific integrated circuits (ASICs), digital signal processors (DSPs), programmable gate arrays (PGAs), and/or programmable logic controllers (PLCs), or any other integrated or non-integrated circuit.

During operation of the WI-IUD 300, the processor 310 modulates light output from the laser diodes 314, which includes a first red laser diode 314a (R), a second green laser diode 314b (G), a third blue laser diode 314c (B), and a fourth infrared laser diode 314d (IR). The first laser diode 314a emits a first (e.g., red) light signal 320, the second laser diode 314b emits a second (e.g., green) light signal 322, the third laser diode 314c emits a third (e.g., blue) light signal 324, and the fourth laser diode 314d emits a fourth (e.g., infrared) light signal 326. All four of light signals 320, 322, 324, and 326 enter or impinge on the beam combiner 316. Beam combiner 316 could for example be based on any of the beam combiners described in U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), and/or U.S. Non-Provisional patent application Ser. No. 15/852,205 (U.S. Publication Number 2018/0210216).

In the illustrated example, the beam combiner 316 includes optical elements 328, 330, 332, and 334. The first light signal 320 is emitted towards the first optical element 328 and reflected by the first optical element 328 of the beam combiner 316 towards the second optical element 330 of the beam combiner 316. The second light signal 322 is also directed towards the second optical element 330. The second optical element 330 is formed of a dichroic material that is transmissive of the red wavelength of the first light signal 320 and reflective of the green wavelength of the second light signal 322. Therefore, the second optical element 330 transmits the first light signal 320 and reflects the second light signal 322. The second optical element 330 combines the first light signal 320 and the second light signal 322 into a single aggregate beam (shown as separate beams for illustrative purposes) and routes the aggregate beam towards the third optical element 332 of the beam combiner 316.

The third light signal 324 is also routed towards the third optical element 332. The third optical element 332 is formed of a dichroic material that is transmissive of the wavelengths of light (e.g., red and green) in the aggregate beam comprising the first light signal 320 and the second light signal 322 and reflective of the blue wavelength of the third light signal 324. Accordingly, the third optical element 332 transmits the aggregate beam comprising the first light signal 320 and the second light signal 322 and reflects the third light signal 324. In this way, the third optical element 332 adds the third light signal 324 to the aggregate beam such that the aggregate beam comprises the light signals 320, 322, and 324 (shown as separate beams for illustrative purposes) and routes the aggregate beam towards the fourth optical element 334 in the beam combiner 316.

The fourth light signal 326 is also routed towards the fourth optical element 334. The fourth optical element 334 is formed of a dichroic material that is transmissive of the visible wavelengths of light (e.g., red, green, and blue) in the aggregate beam comprising the first light signal 320, the second light signal 322, and the third light signal 324 and reflective of the infrared wavelength of the fourth light signal 326. Accordingly, the fourth optical element 334 transmits the aggregate beam comprising the first light signal 320, the second light signal 322, and the third light signal 324 and reflects the fourth light signal 326. In this way, the fourth optical element 334 adds the fourth light signal 326 to the aggregate beam such that the aggregate beam 336 comprises portions of the light signals 320, 322, 324, and 326. The fourth optical element 334 routes the aggregate beam 336 towards the controllable scan mirror 318.

The scan mirror 318 is controllably orientable and scans (e.g. raster scans) the beam 336 to the eye 306 of the user of the WHUD 300. In particular, the controllable scan mirror 318 scans the laser light onto the transparent combiner 304 carried by the eyeglass lens 308. The scan mirror 318 may be a single bi-axial scan mirror or two single-axis scan mirrors may be used to scan the laser light onto the transparent combiner 304, for example. In at least some implementations, the transparent combiner 304 may be a holographic: combiner with at least one holographic optical element. The transparent combiner 304 redirects the laser light towards a field of view of the eye 306 of the user. The laser light redirected towards the eye 306 of the user may be collimated by the transparent combiner 304, wherein the spot at the transparent combiner 304 is approximately the same size and shape as the spot at the eye 306 of the user. The laser light may be converged by the eye 306 to a focal point at the retina of eye 306 and creates an image that is focused. The visible light may create display content in the field of view of the user, and the infrared light may illuminate the eye 306 of the user for the purpose of eye tracking.

Figure 4:
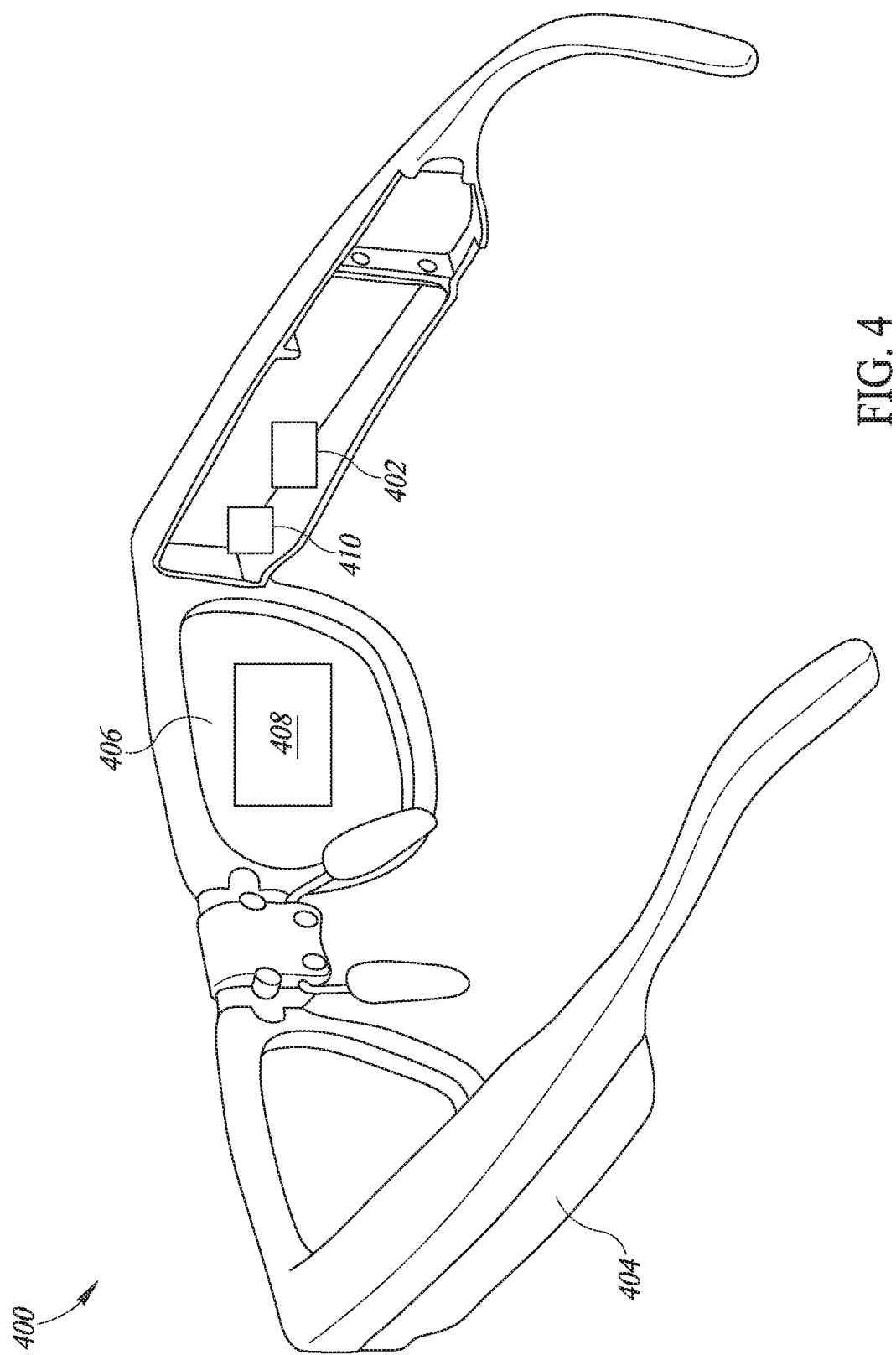
FIG. 4 is an isometric view of a wearable heads-up display with a laser projector that includes an optical engine, in accordance with the present systems, devices, and methods.

FIG. 4 is a schematic diagram of a wearable heads-up display (WHUD) 400 with a laser projector 402 in accordance with the present systems, devices, and methods. WHUD 400 includes a support structure 404 with the shape and appearance of a pair of eyeglasses that in use is worn on the head of the user. The support structure 404 carries multiple components, including eyeglass lens 406, a transparent combiner 408, the laser projector 402, and a controller or processor 410. The laser projector 402 may be similar or identical to the laser projector 302 of FIG. 3. For example, the laser projector 402 may include an optical engine, such as the optical engine 100 or the optical engine 312. The laser projector 402 may be communicatively coupled to the controller 410 (e.g., microprocessor) which controls the operation of the projector 402, as discussed above. The controller 402 may include or may be communicatively coupled to a non-transitory processor-readable storage medium (e.g., memory circuits such as ROM, RAM, FLASH, EEPROM, memory registers, magnetic disks, optical disks, other storage), and the controller may execute data and/or instruction from the non-transitory processor readable storage medium to control the operation of the laser projector 402.

In operation of the WHUD 400, the controller 410 controls the laser projector 402 to emit laser light. As discussed above with reference to FIG. 3, the laser projector 402 generates and directs an aggregate beam (e.g., aggregate beam 336 of FIG. 3) toward the transparent combiner 408 via at least one controllable mirror (not shown in FIG. 4). The aggregate beam is directed towards a field of view of an eye of a user by the transparent combiner 408. The transparent combiner 408 may collimate the aggregate beam such that the spot of the laser light incident on the eye of the user is at least approximately the same size and shape as the spot at transparent combiner 408. The transparent combiner 408 may be a holographic combiner that includes at least one holographic optical element.

Figure 5:
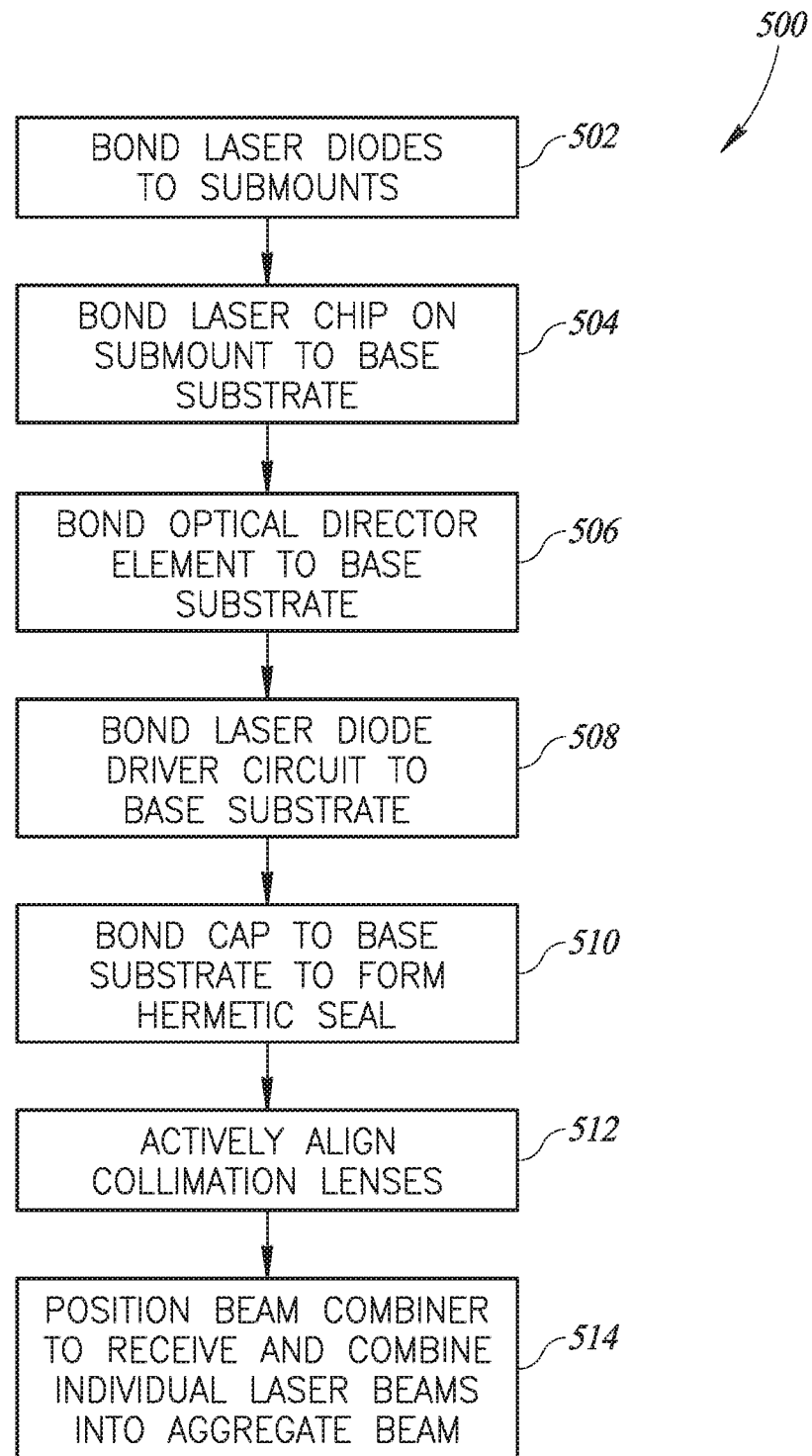
FIG. 5 is a flow diagram of a method of manufacturing an optical engine, in accordance with the present systems, devices, and methods.

FIG. 5 is a flow diagram of a method 500 of manufacturing an optical engine, in accordance with the present systems, devices, and methods. The method 500 may be implemented to manufacture the optical engine 100 of FIGS. 1A-1B or the optical engine 312 of FIG. 3, for example. It should be appreciated that methods of manufacturing optical engines according to the present disclosure may include fewer or additional acts than set forth in the method 500. Further, the acts discussed below may be performed in an order different than the order presented herein.

At 502, a plurality of laser diodes may be bonded to a respective plurality of submounts. In at least some implementations, this method may be performed by an entity different than that manufacturing the optical engine. For example, in at least some implementations, one or more of the plurality of laser diodes (e.g., green laser diode, blue laser diode) may be purchased as already assembled laser CoSs. For ease of handling and simplification of the overall process, in at least some implementations it may be advantageous to also bond laser diodes that cannot be procured on submounts to a submount as well. As a non-limiting example, in at least some implementations, one or more of the laser diodes may be bonded to a corresponding submount using an eutectic gold tin (AuSn) solder process, which is flux-free and requires heating up top 280° C.

At 504, the plurality of CoSs may be bonded to a base substrate. The base substrate may be formed from a material that is RF compatible and is suitable for hermetic sealing. For example, the base substrate may be formed from low temperature co-fired ceramic (LTCC), alumina, etc. Since several CoSs are bonded next to each other on the same base substrate, it may be advantageous to either "step-solder" them sequentially or to use a bonding technique that does not rely on re-melting of solder materials. It may also be important that the laser diode-to-submount bonding does not re-melt during bonding of the CoSs to the base substrate. Bonding technologies other than step-soldering that may be used include parallel soldering of all CoS in reflow oven process, thermosonic or thermocompression bonding, transient liquid phase (TLP) bonding, laser soldering, etc. Some of these example bonding technologies are discussed below.

For parallel soldering of all CoSs in a reflow oven process, appropriate tooling is required to assure proper bonding and alignment during the process. An advantage of this process is the parallel and hence time efficient bonding of all CoSs at once and even many assemblies in parallel. A possible disadvantage of this process is the potential loss of the alignment of components during the reflow process. Generally, a soldering cycle ideally needs a few minutes of dwell time. Preheating may be used to reduce the soldering time, which requires a few minutes for such a process depending on the thermal mass of the components being bonded. Thus, a batch process may be used with regular soldering to reduce the assembly costs with high throughput at the expense of alignment tolerance.

For thermosonic or thermocompression bonding, thick gold metallization may be used but no extra solder layer is required. The temperatures for thermocompression bonding might be as high as 300 to 350° C. to have a good bond with a good thermal conductivity. Thermosonic bonding may be used to reduce the pressure and temperature needed for bonding, which may be required for at least some components that might not tolerate the temperatures required for thermocompression bonding.

Transient liquid phase (MP) bonding may also be used. There are many different reaction couples that may be used, including gold-tin, copper-tin, etc. With this method, a liquid phase is formed during the bonding which will solidify at the same temperature. The re-melting temperatures of the bond are much higher than the soldering temperatures.

In at least some implementations, laser soldering may be used to bond some or all of the components of the optical engine. Generally, the thermal characteristic of the parts to be bonded may be important when implementing a laser soldering process.

Subsequent reflows of solder are not recommended due to liquid phase reaction or dissolution mechanisms which may reduce the reliability of the joint. This could result in voiding at the interface or a reduction in strength of the joint itself. In order to mitigate potential reflow dissolution problems, other options can be taken into consideration, which do not rely on extreme heating of the device and can be favorable in terms of production cost. For example, bonding of the base substrate with adhesives (electrically conductive for common mass, or non-conductive for floating) may be acceptable with respect to heat transfer and out-gassing. Further, in at least some implementations nanofoils may be used as a solder pre-form, which enables localized heat transfer. In such implementations, dedicated heat transfer support metallizations may be deposited onto the two components being joined together. This method may be more advantageous for CoS-to-base substrate mounting compared to chip-to-subtnount bonding.

At 506, the optical director element may be bonded to the base substrate proximate the laser CoSs. The optical director element may be bonded to the base substrate using any suitable bonding process, including the bonding processes discussed above with reference to act 504.

At 508, the laser diode driver circuit may be bonded to the base substrate. As noted above, the laser diode driver circuit may be bonded to the base substrate such that the distance between the laser diode driver circuit and the laser CoSs is minimized. The process used to bond the laser diode driver circuit to the base substrate may be any suitable bonding process, such as bonding processes commonly used to bond surface mount devices (SMD) to circuit boards.

At 510, the cap may be bonded to the base substrate to form a hermetic seal between the interior volume of the encapsulated package and an exterior environment. As noted above, it may be desirable to maintain a specific atmosphere for the laser diode chips for reliability reasons. In at least some implementations, adhesive sealing may be undesirable because of the high permeability of gases. This is especially the case for blue laser diodes, which emit blue laser light that may bake contamination on facets and windows, thereby reducing transparency of the optical window.

During the sealing process, the atmosphere may be defined by flooding the package accordingly. For example, the interior volume of the encapsulated package may be flooded with an oxygen enriched atmosphere that burns off contaminants which tend to form on interfaces where the laser beam is present. The sealing itself may also be performed so as to prevent the exchange between the package atmosphere and the environment. Due to limitations concerning the allowed sealing temperature, e.g., the components inside the package should not be influenced, in at least some implementations seam welding or laser assisted soldering/diffusion bonding may be used.

At 512, the collimation lenses may be actively aligned. For example, once the laser diode driver circuit has been bonded and the cap has been sealed, the laser diodes can be turned on and the collimations lenses for each laser diode can be actively aligned. In at least some implementations, each of the collimation lenses may be positioned to optimize spot as well as pointing for each of the respective laser diodes.

At 514, the beam combiner may be positioned to receive and combine individual laser beams into an aggregate beam. As discussed above, the beam combiner may include one or more diffractive optical elements that function to combine the different color beams into an aggregate beam. The aggregate beam may be provided to other components or modules, such as a scan mirror of a laser projector, etc.

A person of skill in the art will appreciate that the teachings of the present systems, methods, and devices may be modified and/or applied in additional applications beyond the specific WHUD implementations described herein. In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources one or more battery(ies)), a wireless transceiver for sending/receiving wireless communications, and/or a tethered connector port for coupling to a computer and/or charging the one or more on-board power source(s).

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be Mored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data. Sheet which are owned by Thalmic Labs Inc., including at least U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), U.S. Non-Provisional patent application Ser. No. 15/852,205 (U.S. Publication Number 2018/0210216), U.S. Provisional Patent Application Ser. No. 62/575,677, U.S. Provisional Patent Application Ser. No. 62/591,550, U.S. Provisional Patent Application Ser. No. 62/597,294, U.S. Provisional Patent Application Ser. No. 62/608,749, U.S. Provisional Patent Application Ser. No. 62/609,870, U.S. Provisional Patent Application Ser. No. 62/591,030, U.S. Provisional Patent Application Ser. No. 62/620,600, and/or U.S. Provisional Patent Application Ser. No. 62/576,962 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of operating an optical engine, the optical engine comprising a plurality of laser diodes hermetically sealed in an encapsulated package, the method comprising:
   causing the plurality of laser diodes to generate laser light, comprising:
      causing a first laser diode of the plurality of laser diodes to generate first laser light;
      causing a second laser diode of the plurality of laser diodes to generate second laser light; and
      causing a third laser diode of the plurality of laser diodes to generate third laser light;
   receiving the laser light from each of the laser diodes by a single face of an director element;
   redirecting, by the single face of the optical director element, the received laser light toward an optical window of the encapsulated package;
   collimating, by a plurality of collimation lenses, the laser light from the laser diodes that exits the encapsulated package via the optical window to generate a plurality of laser light beams; and
   combining, via a beam combiner, the plurality of laser light beams received from each of the collimation lenses into a single aggregate beam, comprising:
      receiving, by a first optical element of the beam combiner, the first laser light generated by the first laser diode;
      redirecting, by the first optical element, the first laser light to travel in a first direction;
      receiving, by a second optical element of the beam combiner, the first laser light travelling in the first direction and the second laser light generated by the second laser diode;
      transmitting, by the second optical element, the first laser light travelling in the first direction;
      redirecting, by the second optical element, the second laser light to travel in the first direction;
      receiving, by a third optical element of the beam combiner, the first laser light traveling in the first direction, the second laser light traveling in the first direction, and the third laser light generated by the third laser diode;
      transmitting, by the third optical element, the first laser light traveling in the first direction and the second laser light traveling in the first direction; and
      redirecting, by the third optical element, the third laser light to travel in the first direction.

2. The method of claim 1 wherein:
   causing a first laser diode of the plurality of laser diodes to generate first laser light comprises causing the first laser diode to generate the first laser light as red laser light;
   causing a second laser diode of the plurality of laser diodes to generate second laser light comprises causing the second laser diode to generate the second laser light as green laser light; and
   causing a third laser diode of the plurality of laser diodes to generate third laser light comprises causing the third laser diode to generate the third laser light as blue laser light.

3. The method of claim 2 wherein causing the plurality of laser diodes to generate laser light further comprises causing an infrared laser diode to generate infrared laser light.

* * * * *